(12) United States Patent
Nakamura et al.

(10) Patent No.: US 7,791,022 B2
(45) Date of Patent: Sep. 7, 2010

(54) SCANNING ELECTRON MICROSCOPE WITH LENGTH MEASUREMENT FUNCTION AND DIMENSION LENGTH MEASUREMENT METHOD

(75) Inventors: Takayuki Nakamura, Tokyo (JP); Toshimichi Iwai, Tokyo (JP); Soichi Shida, Tokyo (JP); Mitsuo Hiroyama, Tokyo (JP)

(73) Assignee: Advantest Corp., Tokyo (JP)

( * ) Notice: Subject to any disclaimer, the term of this patent is extended or adjusted under 35 U.S.C. 154(b) by 92 days.

(21) Appl. No.: 11/821,028

(22) Filed: Jun. 21, 2007

(65) Prior Publication Data

US 2008/0224039 A1 Sep. 18, 2008

Related U.S. Application Data

(60) Provisional application No. 60/906,619, filed on Mar. 13, 2007, provisional application No. 60/922,513, filed on Apr. 9, 2007.

(51) Int. Cl.
*H01J 37/26* (2006.01)
(52) U.S. Cl. ............... 250/310; 250/306; 250/307; 430/296
(58) Field of Classification Search ............ 250/306, 250/307, 310, 311, 492.1, 492.22, 492.3, 250/309; 430/296, 297, 298, 299
See application file for complete search history.

(56) References Cited

U.S. PATENT DOCUMENTS

| 6,165,652 | A * | 12/2000 | Inoue et al. ............ 430/5 |
| 6,515,296 | B1 * | 2/2003 | Komatsu et al. ....... 250/559.44 |
| 7,335,881 | B2 * | 2/2008 | Tanaka et al. .............. 250/311 |
| 7,385,196 | B2 * | 6/2008 | Shimoma et al. ........... 250/310 |
| 2001/0052573 | A1 * | 12/2001 | Takakuwa .................. 250/398 |
| 2003/0085360 | A1 * | 5/2003 | Parker et al. ............ 250/396 R |
| 2005/0099189 | A1 * | 5/2005 | Cheng et al. ................ 324/751 |
| 2005/0173633 | A1 * | 8/2005 | Tanaka et al. .............. 250/311 |

FOREIGN PATENT DOCUMENTS

| JP | 10-213427 | | 8/1998 |
| JP | 10213427 | * | 8/1998 |
| JP | 11-260692 | | 9/1999 |
| JP | 2004-125737 | | 4/2004 |
| JP | 2004-319622 | | 11/2004 |

\* cited by examiner

*Primary Examiner*—Jack I Berman
*Assistant Examiner*—Nicole Ippolito Rausch
(74) *Attorney, Agent, or Firm*—Muramatsu & Associates (57) ABSTRACT

A scanning electron microscope with a length measurement function includes an electron gun for emitting an electron beam, a measurement target region setting unit for setting a measurement region for a pattern formed on a sample, a storing unit for storing the designated measurement region, a beam blanker unit for controlling an irradiation of the electron beam depending on the measurement region, and a control unit for extracting the designated measurement region from the storing unit, interrupting the electron beam with the beam blanker unit in a region other than the measurement region, irradiating the electron beam onto the sample in the measurement region, capturing an image of the measurement region, and measuring the pattern. The measurement region may be a pair of regions having the same areas as each other.

6 Claims, 9 Drawing Sheets

| x-coordinate | blanker voltage |
|---|---|
| $x_1$ | OFF |
| $x_2$ | ON |
| $x_3$ | OFF |
| $x_4$ | ON |

| y-coordinate | blanker voltage |
|---|---|
| $y_1$ | OFF |
| $y_2$ | ON |

SCANNING ELECTRON MICROSCOPE WITH LENGTH MEASUREMENT FUNCTION AND DIMENSION LENGTH MEASUREMENT METHOD

This application claims the benefit of U.S. Provisional Patent Application Ser. No. 60/906,619 filed Mar. 13, 2007 and U.S. Provisional Patent Application Ser. No. 60/922,513 filed Apr. 9, 2007, all of which are hereby incorporated by reference.

BACKGROUND OF THE INVENTION

1. Field of the Invention

The present invention relates to a scanning electron microscope with a length measurement function, and a sample dimension measurement method to observe and measure a sample by irradiating an electron beam onto the sample.

2. Description of the Prior Art

In the processes of manufacturing semiconductor devices, observation of a sample, measurement of a line width of a pattern and the like are performed by using an electron beam device such as an electron microscope. In observation and measurement of a sample performed by the electron beam device, a scanning operation is performed in the following manner: while an electron beam is irradiated onto a portion of the sample, an amount of electrons such as secondary electrons are converted into luminance so as to display an image on a display device.

As described above, when an observation and measurement of a sample is performed, an electron beam is irradiated thereon. The irradiation of electron beam, however, creates a phenomenon in which a surface of the sample is electrified (electrically charged or charge-up). In other words, depending on a difference between the amount of charged particles incident on a sample and those discharged therefrom, an irradiated surface is electrified positively or negatively. Depending on an electrification potential on a surface of the sample, discharged secondary electrons are accelerated or brought back to the sample, so that an efficiency of the discharging of the secondary electrons changes. Consequently, a problem occurs in which a detected amount of electrons becomes unstable.

To deal with such a problem, in Japanese Patent Application Laid-open Publication No. Hei 10-213427, a method is disclosed in which damage on a circuit pattern and a charge-up thereof is reduced and a dimension of the circuit pattern is measured.

As described above, when a sample is observed by using an electron beam device, a phenomenon in which the sample is electrified occurs. On the other hand, for example, for a sample such as a wafer which is electrically connectable, an electric conductor on an electrically connected wafer is grounded and thereby can be discharged, so that the electrification level of the sample can be reduced. Thus, the electrification does not practically pose any problem.

However, for example, in a state where a process of wiring in manufacturing has been completed, there sometimes exists an isolated portion of a circuit pattern having electrically conductive wiring on a glass substrate, or exists a sparse or dense portion in an electrically conductive wiring.

When such a pattern formed on a semiconductor wafer or on a photomask is measured by using an electron beam device, an electric potential distribution of a surface of a measurement target varies depending on the shape of a pattern, a wiring width, a material, a film thickness, etc. on the measurement target. For example, even when each of the patterns has the same wiring widths, surface potential distributions vary depending on whether intervals at which patterns are formed are small or large. More specifically, the larger the intervals at which the patterns are formed, the higher it becomes the surface potential of the pattern. When the line width of the pattern of a measurement target is increased, a phenomenon occurs in which dimension error becomes large.

As described above, depending on the width of the wiring and the like, a charge-up occurs where a charged amount becomes locally different from one another. Because of the influence of this charge-up, a primary beam is deflected so that a length measurement magnification is changed, thus causing a dimension measurement error.

SUMMARY OF THE INVENTION

The present invention has been made in view of the above described problems, and an object thereof is to provide a scanning electron microscope with a length measurement function, and a sample dimension measurement method to reduce the variation of measured values attributed to a material, the shape of a pattern, and the like of a measurement target, and thereby enabling an improvement of a length measurement accuracy.

The above described problems can be solved by a scanning electron microscope with the length measurement function, which includes: an electron gun emitting an electron beam; a measurement target region setting unit for setting a measurement region for a pattern formed on a sample; a storing unit for storing a designated measurement region; a beam blanker unit for controlling an irradiation of the electron beam depending on the measurement region; and a control unit for extracting the designated measurement region from the storing unit, interrupting the electron beam with the beam blanker unit in a region other than the measurement region, irradiating the electron beam passed through the beam blanker unit onto the sample in the measurement region, capturing an image of the measurement region, and measuring the pattern.

For the scanning electron microscope with the above described length measurement function, the measurement region may be represented by a pair of measurement regions, and the respective regions may be set to have the same areas as each other.

In the scanning electron microscope with a length measurement function of the present invention, a necessary portion is designated, and an electron beam is irradiated onto the portion so that an SEM image is acquired. Further, when a designated range necessary for measurement is a line pattern, the designated range is a pair of regions. One region contains a part of an edge of the line pattern, and the other region contains a part of an opposite edge of the line pattern. The respective regions are designated so as to have the same areas as each other.

As described above, the irradiation of electron beams on the pair of portions, being necessary to be measured and having the same areas as each other, enables the amounts of beams irradiated to be the same. Accordingly, the surface potential of a sample does not increase by an irradiation of an electron beam on a portion outside the designated range, and a length measurement can be performed with high accuracy without being influenced by the shape of a pattern.

Further, in the scanning electron microscope with the above-described length measurement function, the beam blanker unit may include an electrostatic electrode and a beam control plate having an aperture; and the control unit may scan the electron beam, does not apply a voltage to the electrostatic electrode in the measurement region, so that the electron beam is passed through the aperture and irradiated onto the sample, and may apply a voltage to the electrostatic electrode in a region other than the measurement region, so that the electron beam to the region other than the measurement region is interrupted by causing the electron beam to be irradiated onto the beam control plate; and the control unit may refer to coordinate data indicative of the measurement region stored in the storing unit, apply a voltage to the electrostatic electrode, deflect an irradiation position to the measurement region with the electron beam interrupted, set the voltage applied to the electrostatic electrode to OFF, so that the electron beam is irradiated only in the measurement region.

For scanning an electron beam, the scanning electron microscope with the length measurement function of the present invention can use either a raster scan or a vector scan. When the vector scan is used, an electron beam is irradiated after being moved to a portion necessary to be measured, so that measurement time is reduced to a large extent, as compared with the raster scan.

According to another embodiment of the present invention, a method of measuring the dimension of a sample is provided, which uses the scanning electron microscope with the above described length measurement function. The method of measuring the dimension of a sample of the embodiment, which includes an electron gun emitting an electron beam, a measurement target region setting unit for setting a measurement region for a pattern formed on a sample, a storing unit for storing a designated measurement region, and a beam blanker unit for controlling an irradiation of the electron beam depending on the measurement region, and which includes the steps of extracting a measurement region from the storing unit; irradiating an electron beam only on the measurement region; capturing an image of the measurement region; and measuring the dimension of a pattern by extracting an edge of the pattern on the basis of the image.

For the sample dimension measurement method, the measurement region may be represented by a pair of measurement regions, and the respective regions may be set to have the same areas as each other.

DESCRIPTION OF THE PREFERRED EMBODIMENTS

Embodiments of the present invention are described below with reference to the accompanying drawings.

First, a configuration of a scanning electron microscope with a length measurement function is described. Then, a concept of making an accurate length measurement of a pattern is described. Next, a sample dimension measurement method, using the scanning electron microscope with the length measurement function, is described.

Figure 1:
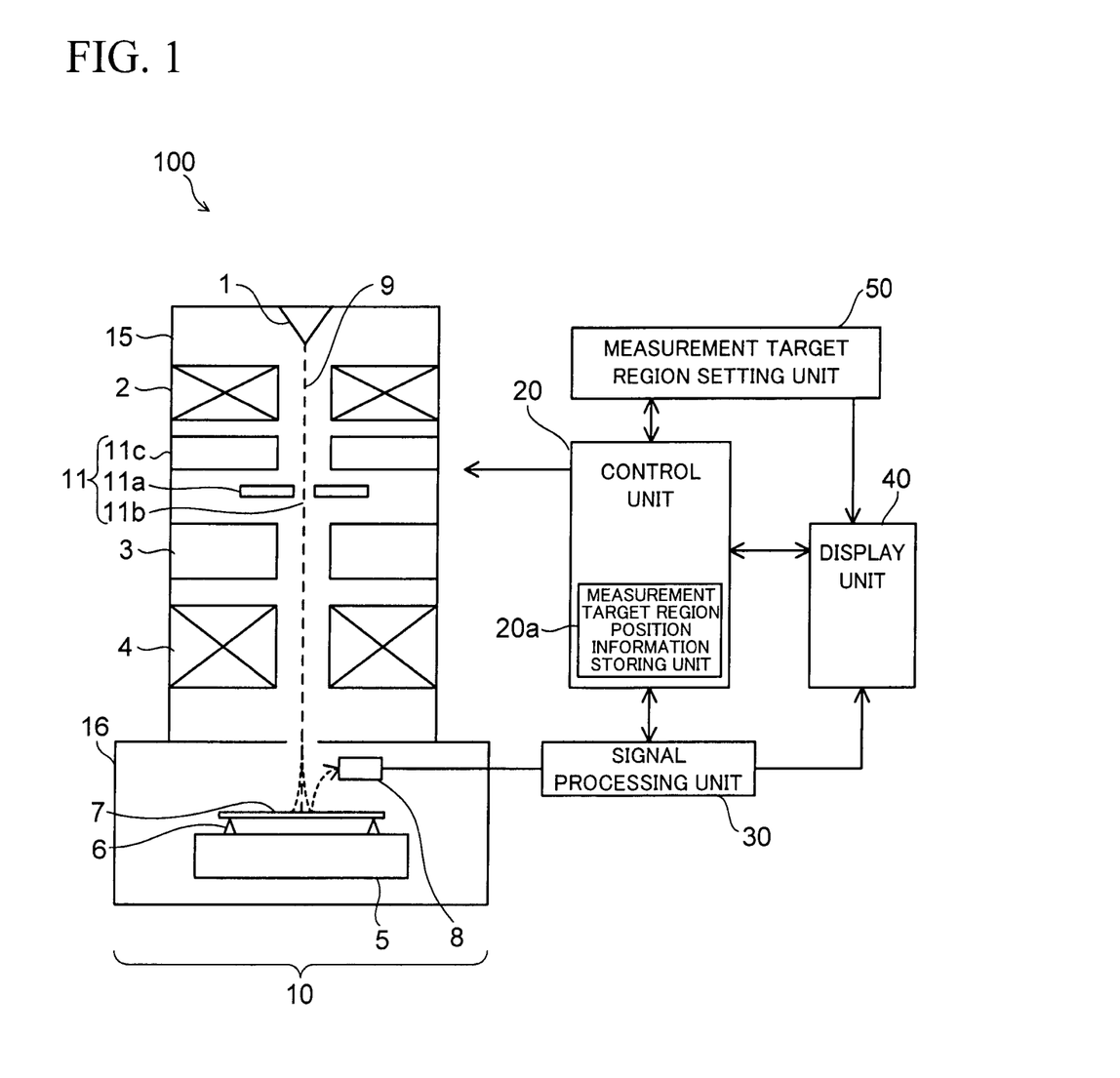
FIG. 1 is a configuration diagram of a scanning electron microscope used in an embodiment of the present invention.

FIG. 1 is a configuration diagram of a scanning electron microscope of a present embodiment.

Such a scanning electron microscope 100 is roughly divided into an electron scanning unit 10, a signal processing unit 30, a display unit 40, a measurement target region setting unit 50, and a control unit 20 which controls the electron scanning unit 10, the signal processing unit 30, the display unit 40, and the measurement target region setting unit 50. The electron scanning unit 10 includes an electron optical column unit 15 and a sample chamber 16.

The electron optical column unit 15 includes an electron gun 1, a condenser lens 2, a beam blanker unit 11, a deflecting coil 3, and an objective lens 4, and the sample chamber 16 includes an XY stage 5 and a sample supporting unit 6.

The beam blanker unit 11 includes a beam control plate 11a including an aperture 11b, and an electrostatic electrode 11c which deflects an electron beam. The beam blanker unit 11 is disposed between the condenser lens 2 and the deflecting coil 3.

The sample chamber 16 is connected to both of a motor (not illustrated) for moving the XY stage 5 and an evacuator (not illustrated) for maintaining the inside of the sample chamber 16 in a predetermined reduced-pressure atmosphere.

An electron beam 9 radiated by the electron gun 1 is designed to be irradiated onto a sample 7 on the XY stage 5 through the condenser lens 2, the aperture 11b of the beam blanker unit 11, the deflecting coil 3, and the objective lens 4.

An amount of secondary electrons or reflection electrons discharged from the sample 7 by irradiating the electron beam 9 thereon is detected by an electron detector 8 including a scintillator and the like. A detected amount thus obtained is converted into a digital amount by an A/D converter in the signal processing unit 30, and further converted into a luminance signal to be displayed on the display unit 40. An amount of the deflection of electrons of the deflecting coil 3 and an amount of scanned images on the display unit 40 are controlled by the control unit 20.

The measurement target region setting unit 50 designates a range to be irradiated with the electron beam 9, from among patterns formed on the sample 7. A designated range is stored in a measurement target region position information storing unit 20a as positional coordinate data.

The control unit 20 is composed of a microcomputer, and stores therein a program to execute measurement. Moreover, the control unit 20 determines an acceleration voltage of the electron beam 9, and applies an acceleration voltage to the electron gun 1 electrically connected to the control unit 20.

By using the scanning electron microscope 100 configured in the above described manner, observation or measurement is performed on the sample 7 loaded onto the XY stage 5 with the sample supporting unit 6 interposed therebetween. At this time, position information on a region to be irradiated with an electron beam is extracted from the measurement target region position information storing unit 20a. Thus, the electrode 11c of the beam blanker 11 and the deflecting coil 3 are controlled so that an electron beam is irradiated only in a designated irradiation region.

Next, the measurement concept of a pattern with high accuracy using the scanning electron microscope 100 of the present invention is described.

As described above, depending on the case where line patterns are formed sparsely or densely, potential distributions of a sample surface irradiated with an electron beam vary. Consequently, depending on patterns having different thicknesses, potential distributions of the sample surface irradiated with an electron beam also vary.

Figure 2:
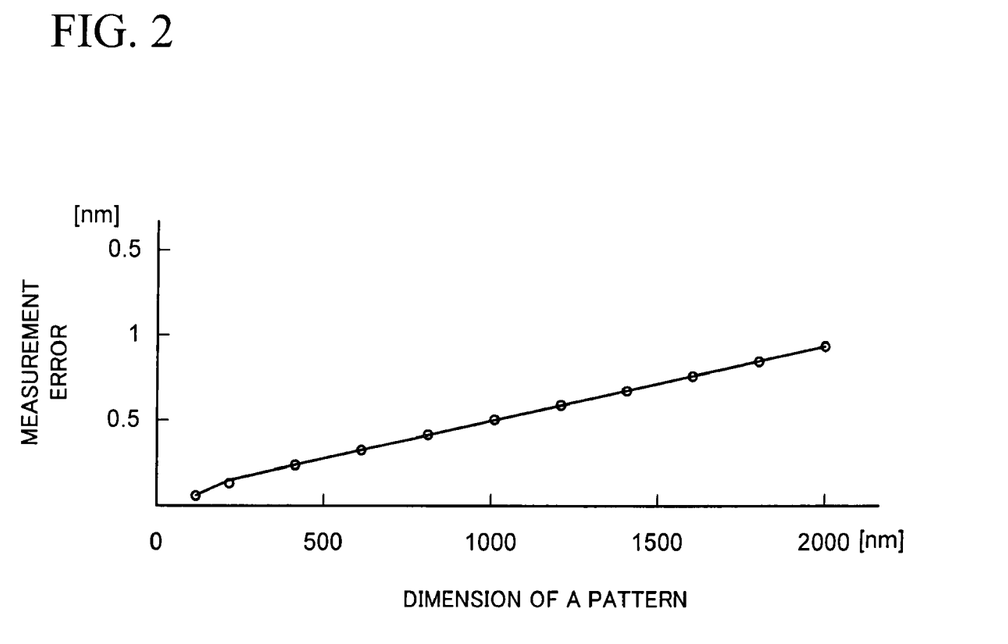
FIG. 2 is a diagram illustrating a relationship between the thickness of a line pattern and dimension error.

The inventor has confirmed that a potential of a surface of a thick pattern is large compared to that of a thin pattern. FIG. 2 is a diagram showing a relationship between the dimension of a pattern and measurement error. As shown in FIG. 2, it can be seen that the thicker the pattern, the greater the measurement error.

In the present embodiment, in order to cause a potential distribution of a pattern surface on a measurement portion to be fixed without depending on the thickness of a pattern and a shape thereof, particular attention has been paid to an irradiation range of an electric beam and an amount of its irradiation.

A basic concept to cause the surface potential distribution of a pattern to be fixed is to irradiate an electron beam only on a measurement target region of a pattern, and thereby to capture an SEM image of the region.

Next, descriptions are given for the cases where (1) a width of a line pattern is measured, (2) a hole pattern is measured, and (3) a width of a line pattern and a pitch thereof are simultaneously measured.

(1) Case Where a Width of a Line Pattern is Measured

In this case, a pair of regions is designated as measurement target regions. One region contains a part of an edge of a line pattern, and the other region contains a part of an opposite edge of the line pattern.

Figure 3A:
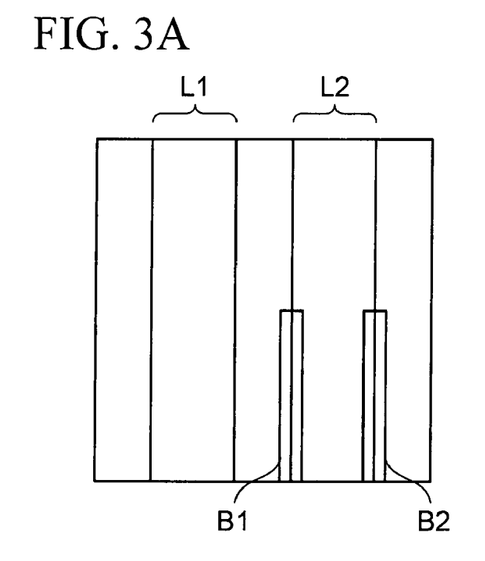
FIGS. 3A to 3D are views each showing a first example in which a measurement target region is set.

FIG. 3A shows SEM images of line patterns L1 and L2. Here, the line width of the line pattern L2 is measured.

A measurement target region is designated with a box B1 having a dimension in which an edge portion on the left hand side of the line pattern L2 is observable. A measurement target region is designated with a box B2 having a dimension in which an edge portion on the right hand side of the line pattern L2 is observable. It is preferred that these boxes B1 and B2 be designated so that the boxes B1 and B2 have the same areas as each other.

FIG. 3A shows a state in which, for the line pattern L2, the boxes B1 and B2 having the same areas as each other are designated. When the areas of the boxes B1 and B2 are the same, potential distributions on the surface potentials of the respective regions are the same. Accordingly, even when a trajectory of an irradiation electron beam is bent due to an influence of a surface potential of a pattern, electron beams irradiated over the regions designated by the boxes B1 and B2 have the same trajectories. As a result, irradiation ranges do not differ greatly from each other, so that the regions can be measured at the same magnifications.

Figure 3B:
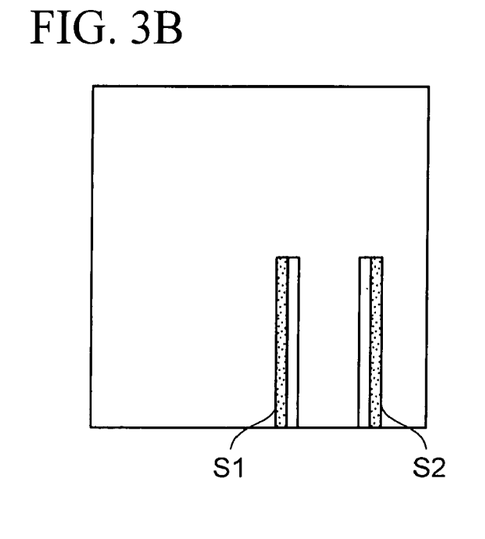

FIG. 3B shows images S1 and S2 which can be captured by irradiating electron beams in measurement target regions designated by the boxes B1 and B2 respectively.

Figure 3C:
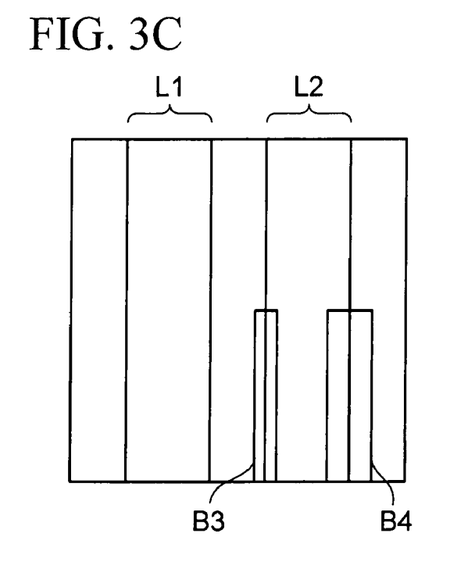
Figure 3D:
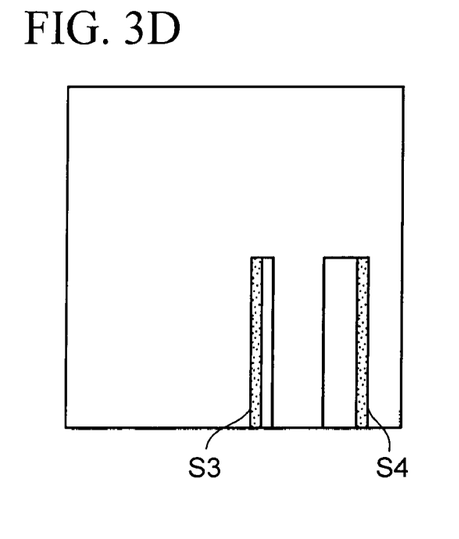

On the other hand, as shown in FIG. 3C, when the areas of boxes B3 and B4 are different, potential distributions of the surface potentials of the respective regions become different when irradiated by the electron beam. In the case of FIG. 3C, the surface potential of the region, designated by the box B4 having a large area, becomes high, so that a trajectory of an electron beam is strongly influenced. Consequently, since the irradiation ranges for the boxes B3 and B4 are different, SEM images at different magnifications are captured. As shown in FIG. 3D, the position of the edge captured from the image S4 is different from that of the edge captured from the image S2, resulting in that the width of the line pattern L2 is deviated from the actual one.

The dimensions of the boxes B1 and B2 are set so that the edges can be observed. By setting of the boxes B1 and B2 to have smaller areas, more accurate measurement can be performed because unnecessary secondary electrons from any region other than the measurement regions are not generated.

When a pitch for line patterns is measured, a pair of regions representing measurement targets is designated in the same way as measurement of the line width of the pattern.

Measurement of a pitch for line patterns is described with reference to FIG. 4. Lines L3 and L5 are selected as targets for measuring a pitch. A measurement target region is designated with a box B5 having a dimension in which an edge portion on the left hand side of the line L3 can be observed. In the same manner, a measurement target region is designated with a box B6 having a dimension in which an edge portion on the left hand side of the line L5 can be observed. Further, it is preferred that the dimensions of the boxes B5 and B6 be set so that the boxes B5 and B6 have the same areas as each other.

Figure 4A:
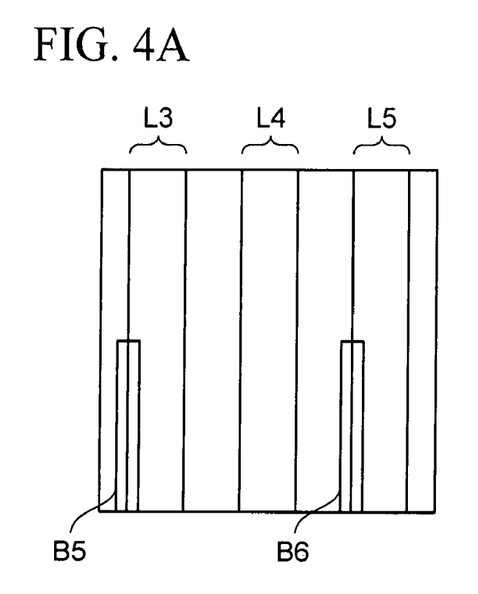
FIGS. 4A to 4D are views each showing a second example in which a measurement target region is set.

FIG. 4A shows a state in which, for the lines L3 and L5, the boxes B5 and B6 having the same areas as each other are designated. As shown in FIG. 4A, when the areas of the boxes B5 and B6 are the same, surface potential distributions of the respective regions are the same; consequently, even when a trajectory of an irradiation electron beam is bent due to a surface potential, electron beams irradiated over the regions designated by the boxes B5 and B6 have the same trajectories.

Figure 4B:
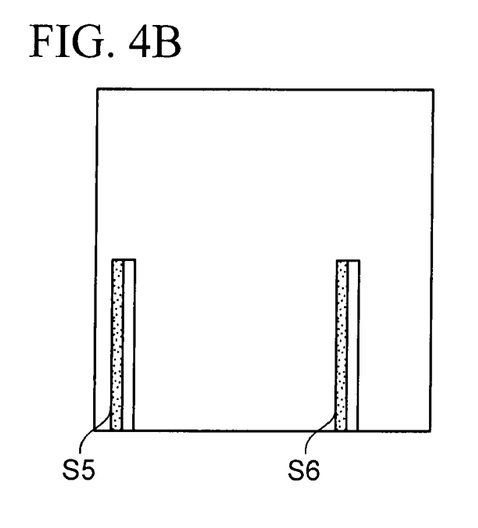

FIG. 4B shows images S5 and S6 captured by irradiating electron beams in the measurement target regions designated by the boxes B5 and B6 respectively.

Figure 4C:
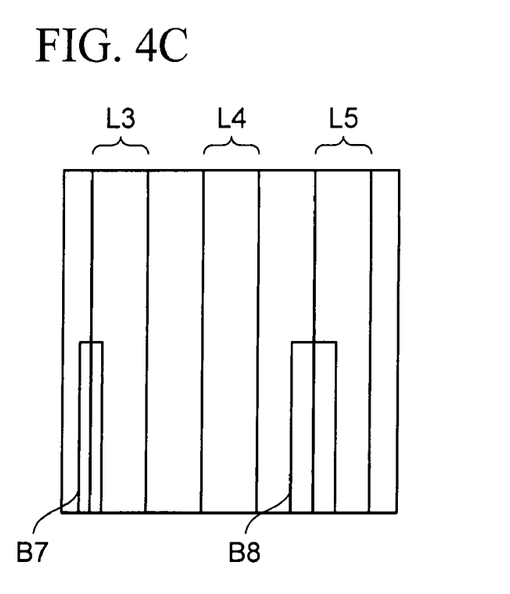
Figure 4D:
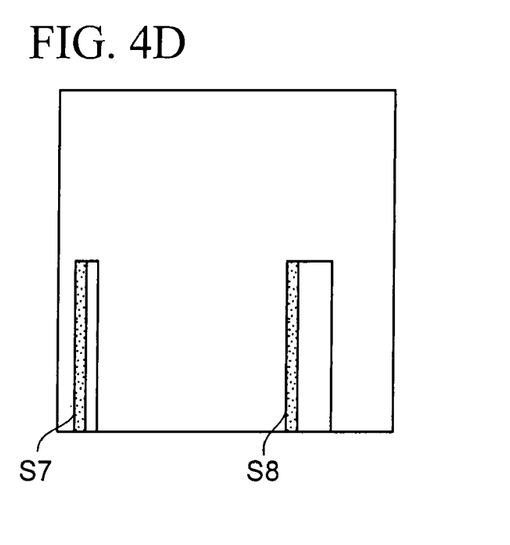

On the other hand, as shown in FIG. 4C, when the areas of boxes B7 and B8 are different, the surface potential distributions of the respective regions become different when irradiated by the electron beam. In the case of FIG. 4C, the surface potential of the region designated by the box B8 having a large area becomes high, so that a trajectory of an electron beam is strongly influenced. Consequently, as shown in FIG. 4D, an SEM image S8 at a different position from the actual one is captured. Hence, a pitch between the line 3 and the line 5 is also deviated from the actual pitch.

(2) Case Where a Hole Pattern is Measured

In this case, two pairs of regions are designated as measurement target regions. One region contains an edge of the hole pattern, and the other region contains an opposite edge of the hole pattern.

A hole pattern H1 in FIG. 5 is set to be a target. A measurement target region is designated with a box B9 having a dimension in which an edge portion on the left hand side of the hole pattern H1 is observable. Further, a measurement target region is designated with a box B10 having a dimension in which an edge portion on the right hand side of the hole pattern H1 is observable. In addition, a measurement target region is designated with a box B11 having a size in which an edge portion on the upper side of the hole patter H1 is observable, and another measurement target region is designated with a box B12 having a size in which an edge portion on the lower side of the hole patter H1 is observable. These boxes B9 to B12 are set so that the boxes B9 to B12 have the same areas as each other.

Figure 5A:
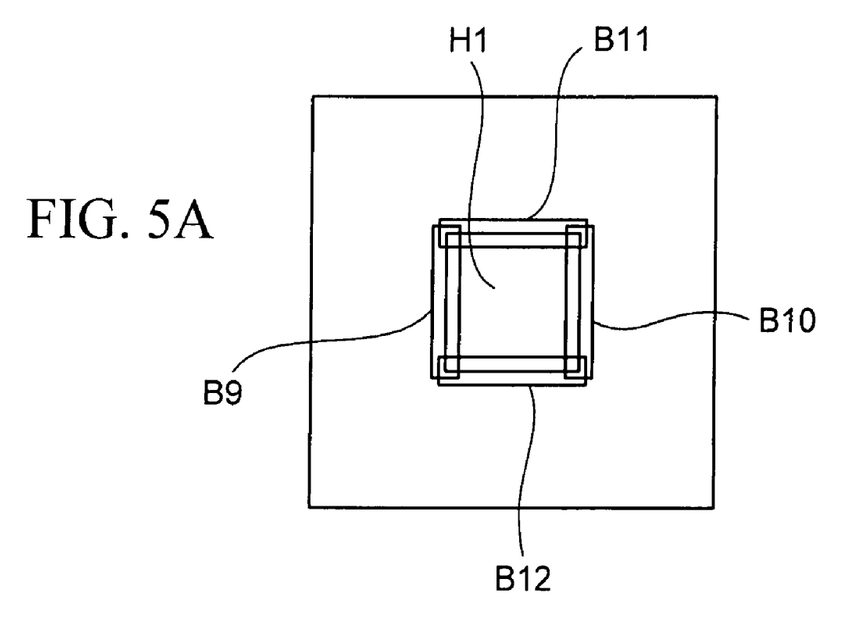
FIGS. 5A and 5b are views each showing a third example in which a measurement target region is set.
Figure 5B:
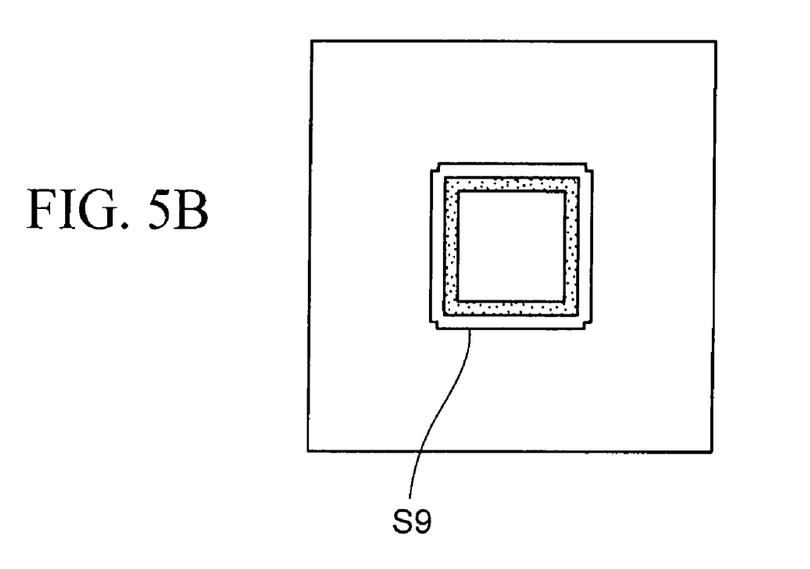

FIG. 5A shows a state in which, for the hole pattern H1, the boxes B9 to B12 are designated. As shown in FIG. 5A, when the areas of the boxes B9 to B12 are the same, potential distributions of the surface potentials of the respective regions are the same. Accordingly, even when a trajectory of an irradiation electron beam is bent due to an influence of a surface potential of a pattern, electron beams irradiated over the regions designated by the boxes B9 to B12 have the same trajectories. In other words, electron beams of the same amount are irradiated in the regions designated with the boxes B9 to B12. Consequently, as shown in FIG. 5B, an SEM image S9 at the same magnification can be captured.

(3) Case Where a Width of a Line Pattern and a Pitch are Simultaneously Measured.

In this case, as measurement target regions, a pair of regions is designated. One region contains a part of an edge of the line pattern, and the other region contains a part of an opposite edge of the line pattern. And another pair of regions is designated as measurement target regions to measure a pitch. One region contains a part of an edge of one line pattern, and the other region contains a part of an edge of the other line pattern.

Figure 6A:
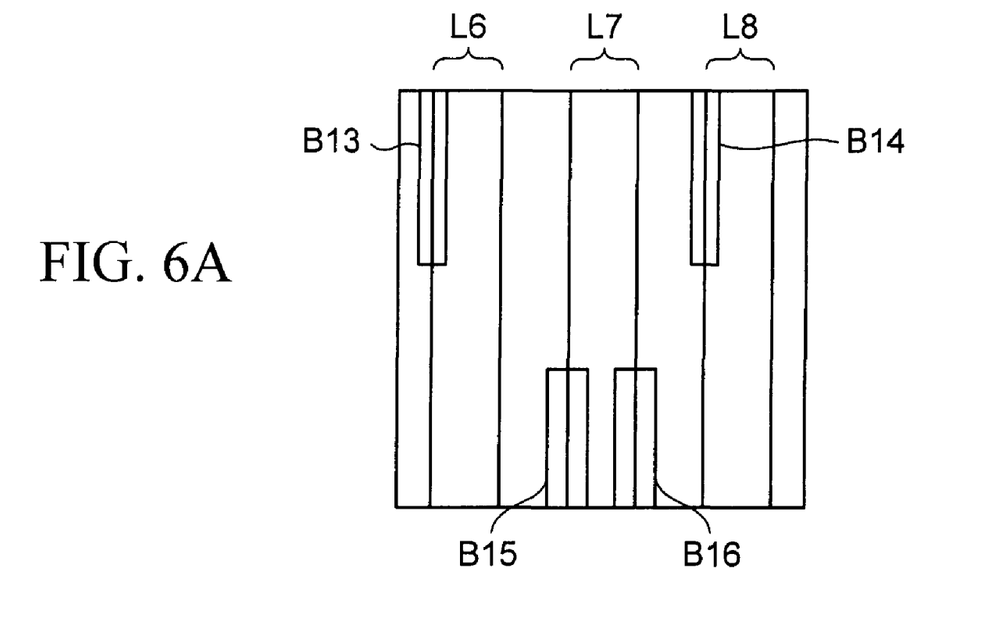
FIGS. 6A and 6B are views each showing a fourth example in which a measurement target region is set.

A line pattern L7 in FIG. 6A is set to be a measurement target for a width of a line pattern. In addition, line patterns L6 and L8 are set to be targets for a pitch measurement.

A measurement target region is designated with a box B15 having a dimension in which an edge portion on the left hand side of the line pattern L7 is observable. Further, a measurement target region is designated with a box B16 having a dimension in which an edge portion on the right hand side of the line pattern L7 is observable. These boxes B15 and B16 are designated so as to have the same areas as each other.

In addition, a measurement target region is designated with a box B13 having a dimension in which an edge portion on the left hand side of the line pattern L6 is observable. Moreover, a measurement target region is designated with a box B14 having a dimension in which an edge portion on the left hand side of the line pattern L8 is observable. These boxes B13 and B14 are designated so as to have the same areas as each other.

Figure 6B:
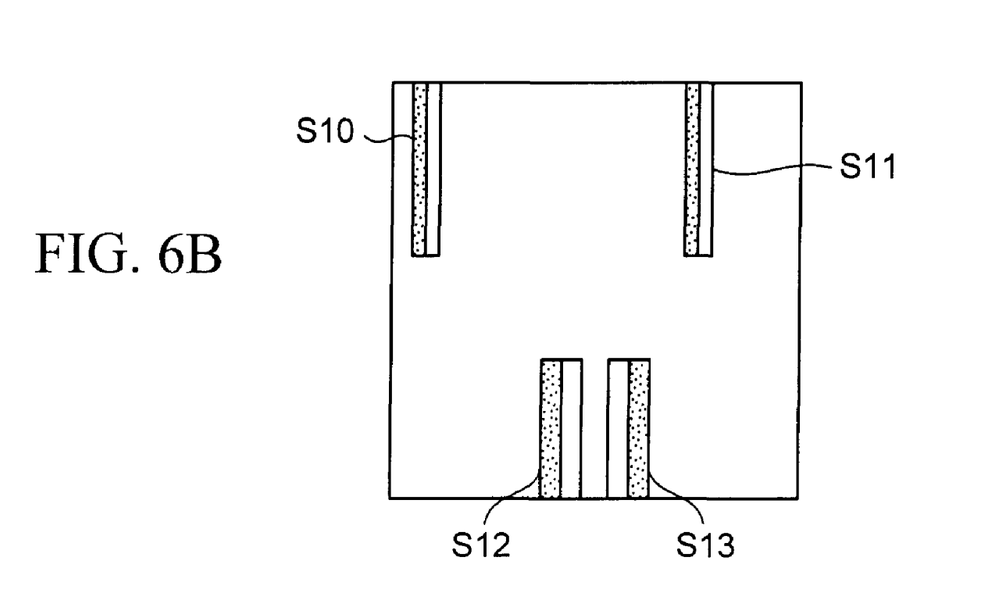

As described above, the pair of regions representing measurement target regions is set to have the same areas as each other. Under this configuration, influences on primary electrons due to the surface potentials can be set to be the same, so that the SEM images S10 to S13 are captured as shown in FIG. 6B, and a measurement with high accuracy can be performed.

As noted above, it is preferable that a pair of regions representing measurement target regions has the same areas as each other. Thus, the boxes B13 to B16 may be set so that the boxes B13 to B16 all have the same areas as each other.

In the above (1) to (3), a measurement target region is designated by the measurement target region setting unit 50. This designation may be performed by using a CAD system based on CAD data in which design information on patterns is stored. Additionally, an SEM image of a sample is captured, and, by using its captured image, a measurement target region may be set. In either case, the measurement target region is designated with a frame (a box), the size of which is variable.

When a measurement target region is designated, coordinate data corresponding to the region are stored in the measurement target region position information storing unit (hereinafter simply referred to as a "storing unit") 20a of the control unit 20.

When measurement is made, the control unit 20 extracts information on the measurement target area stored in the storing unit 20a, and scans an electron beam while irradiating the electron beam only on the designated measurement target region. Thus, the control unit 20 captures an SEM image of the region. For this operation, the scan of the electron beam may be a vector scan or a raster scan.

In the case of the vector scan, measurement target region position information stored in the storing unit 20a is referred, an irradiation position is moved to a coordinate position of a measurement target region, and an electron beam is irradiated in the measurement target region, whereby an SEM of the region is captured. When the irradiation position to the measurement target region is moved, a beam blanker is set to ON in the beam blanker unit 11 so that the electron beam is shot at the beam control plate 11a.

In the case of the raster scan, an electron beam is set to be irradiated onto a sample when the irradiation position is deflected to the measurement target region. In order to irradiate the electron beam only in the designated measurement target region, an ON/OFF control of the electron beam is performed in synchronization with the scanning of the electron beam.

Next, control of an irradiation of an electron beam in the case of the raster scan is described with reference to FIGS. 7A, 7B and FIGS. 8A, 8B.

Figure 7A:
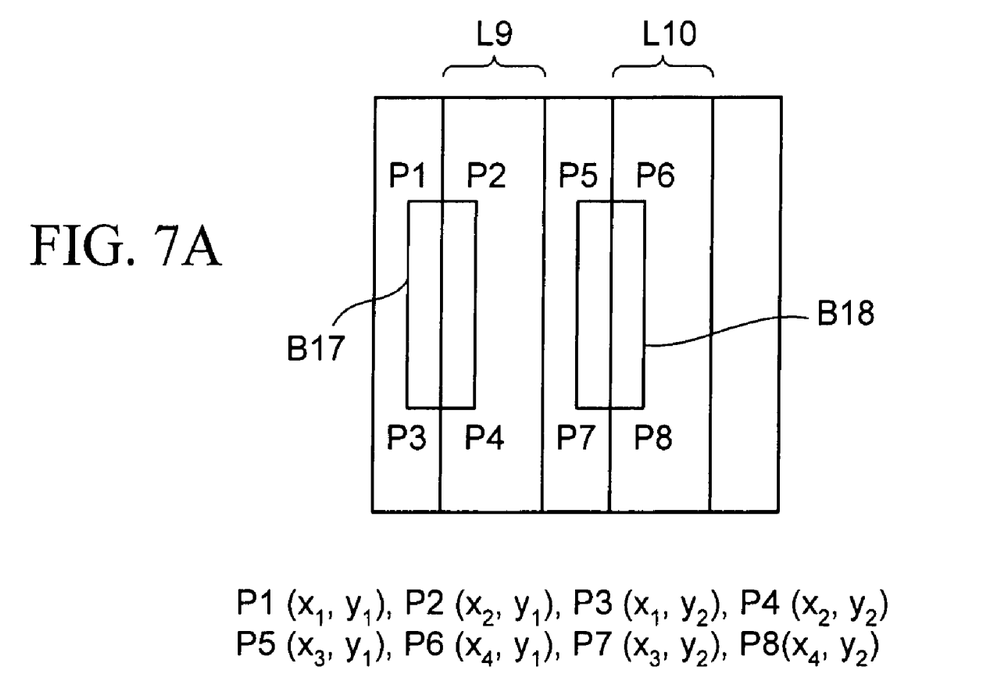
FIGS. 7A and 7B are views illustrating an ON/OFF control table.
Figure 7B:
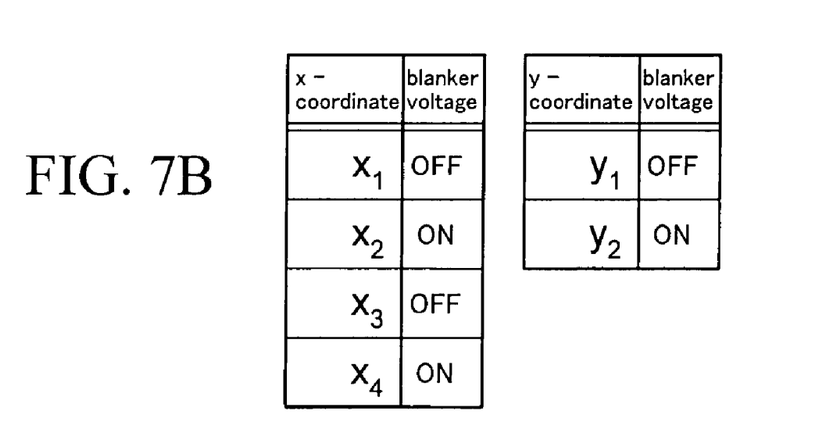

An ON/OFF control of the electron beam is performed with reference to an ON/OFF control table created on the basis of coordinated data indicative of designated measurement target regions. FIGS. 7A and 7B are views illustrating an ON/OFF control table.

FIG. 7A shows a state in which measurement target regions are set with boxes B17 and B18 on SEM images of line patterns L9 and L10. Position coordinates of vertices P1 to P4 of the box 17 are (x1, y1), (x2, y1), (x1, y2), and (x2, y2), respectively. Position coordinates of vertices P5 to P8 of the box 18 are (x3, y1), (x4, y1), (x3, y2), and (x4, y2), respectively. An ON/OFF control table is created so as to correspond to these position coordinates.

FIG. 7B shows an example of the ON/OFF control table. In the ON/OFF control table of FIG. 7B, for the x-direction, the beam blanker unit 11 is set to OFF when an electron beam is deflected to x1, and set to ON when the electron beam is deflected to x2. In other words, a voltage to be applied to the electrostatic electrode 11c of the beam blanker unit 11 is kept off when the electron beam is between x1 and x2, whereby the electron beam 9 is set to be passed through the aperture 11b. The same also applies to the case where a position coordinate of the electron beam in the x-direction is between x3 and x4.

In addition, while the position coordinate of the electron beam in the x-direction is between x2 and x3, the electron beam 9 is set so as not to irradiate the sample 7. In other words, during this period of time, a voltage is applied to the electrostatic electrode 11c of the beam blanker unit 11, so that the electron beam 9 is shot at the beam control plate 11a.

On the other hand, for the y-direction, the beam blanker unit 11 is set to OFF when the electron beam is deflected to y1, and set to ON when the electron beam is deflected to y2.

Figure 8A:
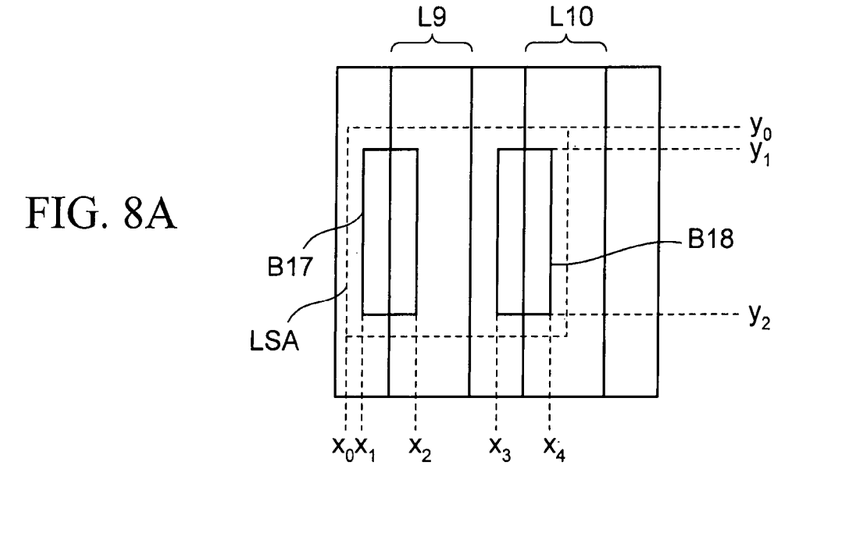
FIGS. 8A and 8B are views illustrating operation of a beam blanker.

Next, operation of the beam blanker unit 11 is described with reference to FIGS. 8A and 8B. FIG. 8A shows the same SEM image as that of FIG. 7A, and a raster scan is performed over a range LSA surrounded by a dashed line.

The beam blanker unit 11 controls ON/OFF of the electron beam 9 in synchronization with a scan signal. FIG. 8B shows scan signals in the x- and y-directions to be applied to an electrostatic electrode of the deflection unit 3. As shown in FIG. 8B, a saw-tooth signal is applied in the x-direction.

A timing at which the electron beam is set to ON or OFF is determined with reference to a position coordinate of a measurement target region obtained from the ON/OFF control table. For example, for the x-direction, since the electron beam should be irradiated onto the sample between x1 and x2, the beam blanker unit 11 is set to OFF and the electron beam is passed through the aperture 11b of the beam blanker 11.

Between x2 and x3, the electron beam is set so as not to irradiate the sample. At this time, the beam blanker unit 11 is set to ON, and the electron beam is deflected so as to shot at the beam control plate 11a.

Figure 8B:
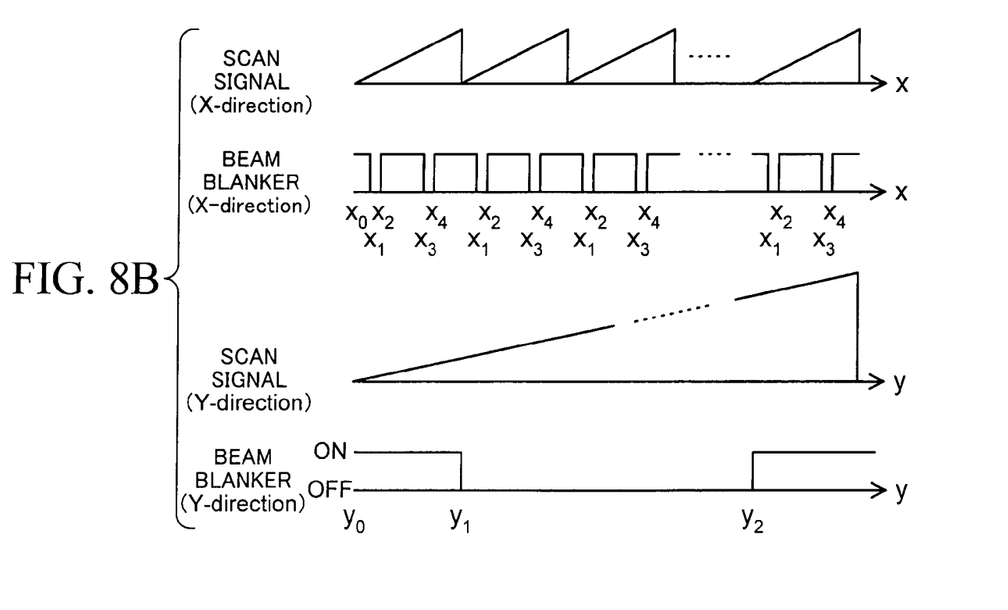

As shown in FIG. 8B, a saw-tooth signal is applied in the y-direction. Coordinates at which the electron beam is set to ON and OFF are obtained from the ON/OFF control table, and, between y1 and y2, the beam blanker unit 11 is set to OFF, and the electron beam is irradiated onto the sample.

When the raster scan is adopted, a scanning operation is not performed on the entire range of a view field, but may be performed on a scanning range having a minimum area so that the scanning range contains the measurement target region as shown by the range LSA surrounded by the dashed line in FIG. 8A. Under this condition, throughput is considerably increased as compared with the case where all the entire range is scanned.

The measurement target region is designated by an operator. However, when a pair of measurement target regions is designated for measuring the line width of a pattern or the like, the measurement target region may be designated automatically. Specifically, the designation of a measurement target region for one edge may be automatically set for the other edge.

As described above, in the case of the scanning electron microscope with the length measurement function of the present invention, a portion necessary to be measured is designated, and an electron beam is irradiated onto the portion, whereby an SEM image is obtained. Moreover, for example, in the case of a line pattern, a designated range necessary to be measured is represented by a pair of regions. One region contains a part of an edge of the line pattern, and the other region contains a part of an opposite edge of the line pattern. The respective regions are designated so as to have the same areas as each other.

As described above, the electron beam is irradiated only in the pair of regions having the same areas as each other that need to be measured, so that the amounts of beams irradiated can be set to be the same. Accordingly, a surface potential of a sample will not increase by an irradiation of an electron beam on a portion outside the designated range, and a length measurement can be performed with high accuracy without being influenced by the shape of a pattern.

In addition, when the vector scan is used, an electron beam is irradiated after being moved to a portion necessary to be measured, so that measurement time is reduced to a large extent, as compared with the raster scan. Furthermore, when the raster scan is used, a range containing a measurement target region is calculated by using a coordinate of the measurement target region. Thus, the raster scan is performed on the range so that much more measurement time can be reduced than scanning on the entire sample.

Figure 9:
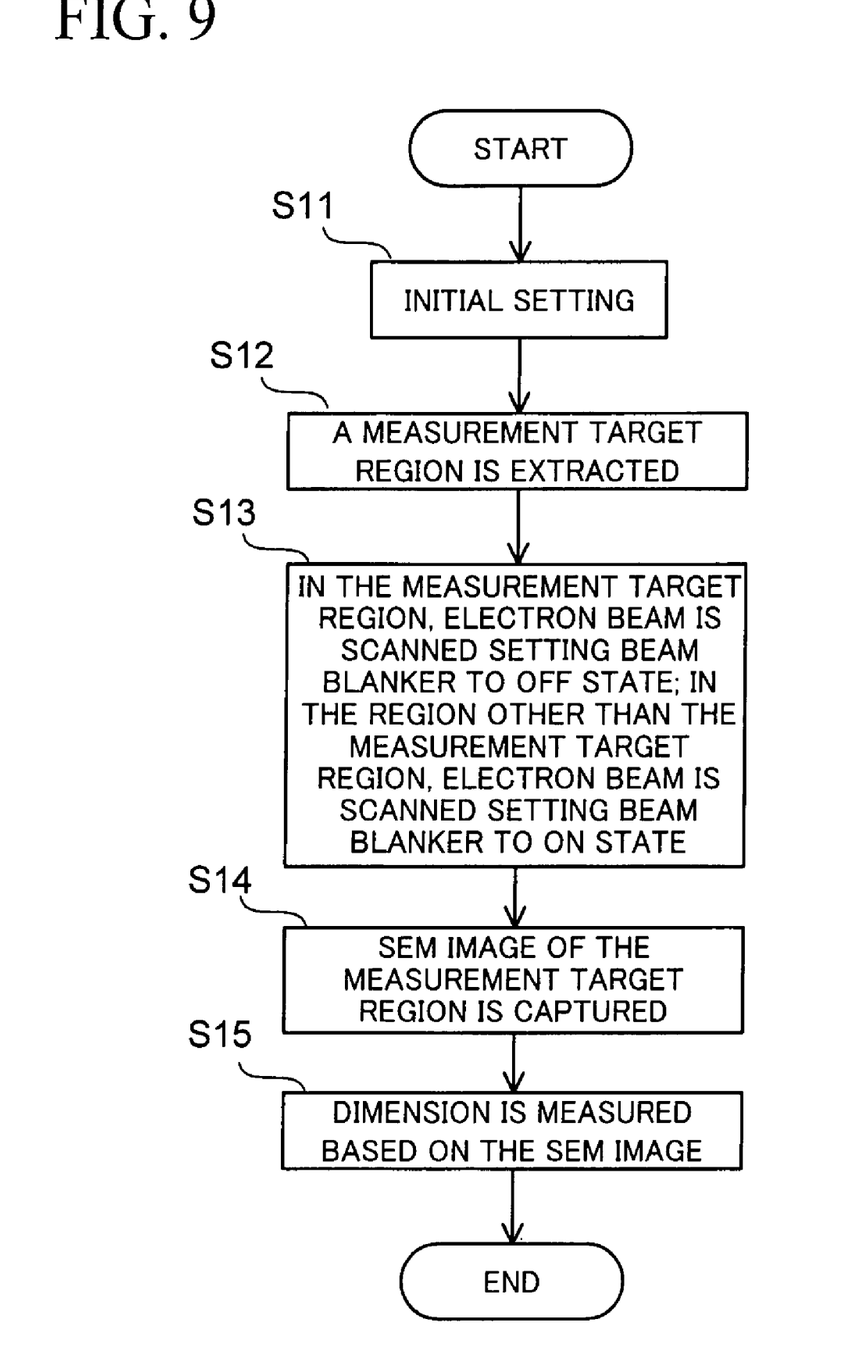
FIG. 9 is a flowchart showing a sample dimension measurement method.

Next, with reference to FIG. 9, a method of measuring the dimension of a sample is described. In the present embodiment, it is assumed that a measurement target region has been set by using the measurement target region setting unit 50, and position information thereof has been stored in the storing unit 20a. Additionally, it is assumed that when a pair of regions is designated as a measurement target region, each region has the same area.

First, in Step S11, an initial setting is performed. In the initial setting, a method (a raster scan or a vector scan) of scanning an electron beam is determined. In the case of the raster scan, an optimum scanning range containing a measurement target region is determined.

In the next step S12, position information on a measurement target region is extracted from the storing unit 20a.

In Step S13, an electron beam is irradiated in a measurement target region. When the scanning method adopts the raster scan, a beam blanker is set to OFF in the measurement target region, and the electron beam is irradiated onto a sample; and, in a region outside the measurement target region, the beam blanker is set to ON so that the electron beam is interrupted. Further, when the scanning method adopts the vector scan, an electron beam irradiation position is moved to the measurement target region, and the electron beam is irradiated in the measurement target region.

In Step S14, an SEM image of the measurement target region is captured.

In Step S15, an edge of a pattern is extracted on the basis of an SEM image captured in Step 14, and the dimension of the pattern is measured.

As described above, in the method of measurement using the scanning electron microscope of the present invention, the electron beam is irradiated only in the measurement target region designated in advance, and an SEM image thereof is captured. Accordingly, the electron beam is not irradiated in any other region than the measurement target region, and secondary electrons from any regions other than the measurement target region are not generated, so that the electron beam is not influenced.

In addition, when measuring the width of a line pattern, a pair of measurement target regions is set. One region contains a part of an edge of the line pattern, and the other region contains a part of an opposite edge of the line pattern. The respective regions are set to have the same areas as each other. Thus, potential distributions on the measurement target regions become the same, and trajectories of electron beams irradiated in respective regions become the same. Accordingly, measurement error due to the variation of the trajectories of the electron beams can be prevented from occurring.

In the present embodiment, the specific example has been described in which the pair of square measurement target regions are used to perform measurement; however, the present invention can also be applied to a plurality of more than one measurement target regions, and may also be applied to measurement of a contour such as a curve.

Further, before measurement is performed, a desired region may be irradiated with an electron beam to make an non-fluctuating and fixed charge-up state. Thus, measurement with even higher accuracy can be performed.

In Step S12 of FIG. 9, although the position information on the measurement target region is extracted from the storing unit 20a, a pre-search may be performed when a line pattern representing a measurement target is identified. In other words, first, rough position information on a measurement target region containing a line pattern, which represents a measurement target, is extracted from the storing unit 20a. Alternatively, after being instructed by an operator, a rough SEM image corresponding to the rough position information is captured. The line pattern representing a measurement target is identified based on this SEM image. Thereafter, a desired region containing the line pattern is irradiated with the electron beam until the desired region is charged up to a fixed level, and the minimum necessary measurement target region for an identified targeted line pattern is irradiated with an electron beam, thus performing measurement. In this case, even when position information of the measurement target region is not that of the minimum region necessary to measure the pattern but is rough position information, the width of a targeted line pattern can be measured with high accuracy.

Further, in Step 13 of FIG. 9, to eliminate noise and the like in the electron detector 8, even when a plurality of measurements are performed and an averaging process is performed on data of a measured result thus obtained, the electron beam is irradiated only in the measurement target region so that a stable measurement accuracy is obtained. Incidentally, for each measurement or for the desired number of times, a desired region may be irradiated with an electron beam to maintain a stable charge-up state.

What is claimed is:

1. A scanning electron microscope with a length measurement function, comprising:
   an electron gun emitting an electron beam;
   a measurement target region setting unit for setting a measurement region where the measurement region is a pair of regions having the same areas each surrounding a corresponding edge of a pattern formed on a sample to measure a length of a pattern or one or more pairs of regions each of pair having the same areas each surrounding a corresponding edge of a plurality of patterns formed on the sample to measure a length between different patterns;
   a storing unit for storing position information on the designated measurement region;
   a beam blanker unit for controlling an irradiation of the electron beam depending on the measurement region; and
   a control unit,
   wherein the control unit extracts the position information of the designated measurement region from the storing unit,
   in a region other than the measurement region, the control unit interrupts the electron beam with the beam blanker unit, and
   in the measurement region, the control unit irradiates the electron beam passed through the beam blanker unit only onto the pair of regions with the same areas, captures an image of the measurement region, and thereby measures the length of the pattern.

2. The scanning electron microscope with the length measurement function according to claim 1,
   wherein the beam blanker unit includes an electrostatic electrode and a beam control plate having an aperture, and wherein the control unit scans the electron beam, and the control unit does not apply a voltage to the electrostatic electrode with respect to the measurement region so that the electron beam is passed through the aperture and irradiated onto the sample,
   in a region other than the measurement region, the control unit causes the electron beam to be irradiated onto the beam control plate by applying a voltage to the electrostatic electrode, so that irradiation of the electron beam to the region other than the measurement region is interrupted.

3. The scanning electron microscope with the length measurement function according to claim 1,
   wherein the beam blanker unit includes an electrostatic electrode and a beam control plate having an aperture,
   the control unit refers to coordinate data indicative of the measurement region stored in the storing unit, applies a voltage to the electrostatic electrode, deflects an irradiation position to the measurement region with the electron beam interrupted, sets the voltage applied to the electrostatic electrode to OFF, and
   the electron beam is thus irradiated only in the measurement region.

4. A method of measuring the dimension of a sample using a scanning electron microscope, which includes an electron gun emitting an electron beam, a measurement target region setting unit for setting a measurement region for a pattern formed on a sample, a storing unit for storing the designated measurement region, and a beam blanker unit for controlling an irradiation of the electron beam depending on the measurement region, comprising the steps of:
   designating the measurement region which is a pair of regions having the same area each surrounding a corresponding edge of a pattern formed on a sample to measure a length of a pattern or one or more pairs of regions each of pair having the same areas each surrounding a corresponding edge of a plurality of patterns formed on the sample to measure a length between different patterns;
   extracting position information on the measurement region from the storing unit;
   irradiating the electron beam only in the measurement region;
   capturing an image of the measurement region; and
   measuring the dimension of the pattern by extracting an edge of the pattern on the basis of the image.

5. The method of measuring the dimension of a sample using the scanning electron microscope according to claim 4, wherein the step of irradiating the electron beam only in the measurement region includes the following steps of:
   setting a minimum region containing the measurement region;
   in the case of the measurement region, setting a voltage applied to an electrostatic electrode of the beam blanker to OFF, so that the electron beam is irradiated onto the sample, and
   in the case of a region other than the measurement region, setting a voltage applied to the electrostatic electrode of the beam blanker to ON, so that the electron beam is interrupted.

6. The method of measuring the dimension of a sample using the scanning electron microscope according to claim 5, wherein the step of irradiating the electron beam only in the measurement region includes the steps of:
   interrupting the electron beam by applying a voltage to the electrostatic electrode, and then deflecting an irradiation position to the measurement region, with reference to coordinate data indicative of the measurement region stored in the storing unit; and
   setting the voltage applied to the electrostatic electrode to OFF, so that the electron beam is irradiated only in the measurement region.

* * * * *